(12) United States Patent
Rogachevskiy et al.

(10) Patent No.: US 11,662,669 B2
(45) Date of Patent: May 30, 2023

(54) APPARATUS AND METHOD FOR MEASURING SUBSTRATE HEIGHT

(71) Applicant: ASML Netherlands B.V., Veldhoven (NL)

(72) Inventors: Andrey Valerievich Rogachevskiy, Den Bosch (NL); Martin Jules Marie-Emile De Nivelle, Waalre (NL); Arjan Gijsbertsen, Vught (NL); Willem Richard Pongers, Veldhoven (NL); Viktor Trogrlic, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/625,466

(22) PCT Filed: Jun. 15, 2020

(86) PCT No.: PCT/EP2020/066432
§ 371 (c)(1),
(2) Date: Jan. 7, 2022

(87) PCT Pub. No.: WO2021/004724
PCT Pub. Date: Jan. 14, 2021

(65) Prior Publication Data
US 2022/0244651 A1 Aug. 4, 2022

(30) Foreign Application Priority Data
Jul. 11, 2019 (EP) ...................................... 19185894

(51) Int. Cl.
*G03F 9/00* (2006.01)
*G03F 7/20* (2006.01)

(52) U.S. Cl.
CPC .......... *G03F 9/7092* (2013.01); *G03F 7/7085* (2013.01); *G03F 9/7026* (2013.01); *G03F 9/7034* (2013.01)

(58) Field of Classification Search
CPC . G03F 7/7085; G03F 7/70483–705841; G03F 7/70616–70683; G03F 7/708;
(Continued)

(56) References Cited

U.S. PATENT DOCUMENTS 7,940,374 B2  5/2011 Lyons
2002/0018207 A1  2/2002 Ina et al.
(Continued)

FOREIGN PATENT DOCUMENTS

JP  S61223604 A  10/1986
JP  S 63-140531 A  6/1988
(Continued)

OTHER PUBLICATIONS

International Search Report and Written Opinion of the International Searching Authority directed to related International Patent Application No. PCT/EP2020/066432, dated Sep. 18, 2020; 10 pages.
(Continued)

*Primary Examiner* — Christina A Riddle
(74) *Attorney, Agent, or Firm* — Sterne, Kessler, Goldstein & Fox P.L.L.C.

(57) ABSTRACT

An apparatus for measuring a height of a substrate for processing in a lithographic apparatus is disclosed. The apparatus comprises a first sensor for sensing a height of the substrate over a first area. The apparatus also comprises a second sensor for sensing a height of the substrate over a second area. The apparatus further comprises a processor adapted to normalize first data corresponding to a signal from the first sensor with a second sensor footprint to
(Continued)

produce a first normalized height data, and to normalize second data corresponding to a signal from the second sensor with a first sensor footprint to produce a second normalized height data. The processor is adapted to determine a correction to a measured height of the substrate based on a difference between the first and second normalized height data.

18 Claims, 3 Drawing Sheets

(58) Field of Classification Search
CPC .. G03F 7/70808; G03F 9/7026; G03F 9/7092; G03F 9/7049; G03F 9/70; G03F 9/7003; G03F 9/7007; G03F 9/7011; G03F 9/7015; G03F 9/7019; G03F 9/7023–7034; G03F 9/7053–7061
USPC ..... 355/18, 30, 52–55, 67–77; 356/399–401, 356/237.1, 237.2–237.6, 614–624, 625, 356/630–632
See application file for complete search history.

(56) References Cited

U.S. PATENT DOCUMENTS

| | | | |
|---|---|---|---|
| 2004/0080737 A1* | 4/2004 | Jasper | G03F 9/7034 250/548 |
| 2005/0030507 A1 | 2/2005 | Teunissen | |
| 2005/0134816 A1 | 6/2005 | Modderman et al. | |
| 2007/0035714 A1 | 2/2007 | Galburt | |
| 2007/0252963 A1 | 11/2007 | Modderman et al. | |
| 2009/0161093 A1* | 6/2009 | Downey | G03F 7/70141 356/139.05 |
| 2009/0325087 A1* | 12/2009 | Lyons | G03F 9/7003 430/30 |
| 2013/0077079 A1* | 3/2013 | Den Boef | G01B 11/0625 355/72 |
| 2015/0029499 A1* | 1/2015 | Wright | G03F 7/7065 356/237.5 |
| 2016/0202177 A1* | 7/2016 | Li | G03F 7/70608 356/364 |
| 2020/0110341 A1* | 4/2020 | Mossavat | G03F 7/70516 |

FOREIGN PATENT DOCUMENTS

| | | | |
|---|---|---|---|
| JP | H04106550 A | 4/1992 | |
| JP | 2001-143991 A | 5/2001 | |
| JP | 2004-039707 A | 2/2004 | |
| JP | 2007-049165 A | 2/2007 | |
| JP | 2010-016372 A | 1/2010 | |
| WO | WO-2015051970 A1 * | 4/2015 | ........... G01B 11/272 |
| WO | WO 2018/019496 | 2/2018 | |
| WO | WO2018/065167 A1 | 4/2018 | |

OTHER PUBLICATIONS

International Preliminary Report on Patentability directed to related International Patent Apphcation No.PCT/EP2020/066432, dated Jan. 11, 2022; 7 pages.

* cited by examiner

APPARATUS AND METHOD FOR MEASURING SUBSTRATE HEIGHT

CROSS-REFERENCE TO RELATED APPLICATIONS

This application claims priority of EP application 19185894.3 which was filed on Jul. 11, 2019 and which is incorporated herein in its entirety by reference.

FIELD

The present invention relates to an apparatus for measuring a height of a substrate and to an associated method and computer apparatus. The substrate may be a substrate for processing in a lithographic apparatus or shaping apparatus for forming a three-dimensional object.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (photoresist) provided on a substrate.

To project a pattern on a substrate a lithographic apparatus may use electromagnetic radiation. The wavelength of this radiation determines the minimum size of features, which can be formed on the substrate. A lithographic apparatus, which uses optical radiation, may be used to form small features on a substrate. For these small features, it is important to accurately control a photolithographic depth-of-focus to ensure product functionality and yield.

The lithographic apparatus may employ one or more sensors, such as optical sensors, to sense a height of an upper surface of a substrate. Such sensors may be used to map a topography of the substrate, such that the photolithographic depth-of-focus may be accurately controlled. That is, measurements of the height of an upper surface of a substrate may be used to control the lithographic apparatus to expose the substrate at a desired focus.

Optical measurement errors may be manifested as incorrect substrate height measurements, potentially resulting in out-of-focus exposures.

Other sensor types, such as pressure sensors that are not susceptible to optical inaccuracies, may be alternatively or additionally used to provide more accurate measurements of the effective height of the upper surface of a substrate. Such alternative sensors, while potentially providing higher degrees of accuracy, may suffer from other adverse effects or limitations, such as low measurement rates for example.

Furthermore, different sensors types may exhibit different measurement characteristics, which may introduce challenges and errors when interpreting data derived from signals received from a plurality of sensors.

It is an object of at least one embodiment of at least one aspect of the invention to seek to obviate or at least mitigate one or more of the aforementioned problems.

SUMMARY

According to a first aspect of the present invention, there is provided an apparatus for measuring a height of a substrate, the apparatus comprising: a first sensor for sensing a height of the substrate over a first area, the first sensor comprising a first sensor footprint; a second sensor for sensing a height of the substrate over a second area, the second sensor comprising a second sensor footprint; and a processor adapted to: normalize a first data corresponding to a first signal from the first sensor with the second sensor footprint to produce a first normalized height data, said first signal corresponds to measured first height; normalize a second data corresponding to a second signal from the second sensor with the first sensor footprint to produce a second normalized height data, said second signal corresponds to measured second height.

This may have an advantage that an impact to a measurement of the height of the substrate that is by differences between the footprints of different sensors and/or sensor types may be effectively minimized.

The processor may be adapted to normalize the first data by convolution of the first data with the second sensor footprint to produce the first normalized height data, and to normalize the second data by convolution of the second data with the first sensor footprint to produce the second normalized height data.

Furthermore, the processor may be adapted to determine a correction to a measured height of the substrate based on a difference between the first normalized height data and the second normalized height data.

The processor may be adapted to determine a topography or height map of at least a portion of the substrate from the determined correction of the measured height and at least one of the measured first height, measured second height, first normalized height data, and second normalized height data.

The first area and the second area may at least overlap, which may be beneficial to correlate measurements of both areas.

A size of the first sensor footprint and the second sensor footprint may be different.

A profile of the first sensor footprint and the second sensor footprint may be different.

This may have an advantage that the invention is applicable to an apparatus comprising different sensors types, wherein each sensor type may sense a height differently, e.g., each sensor may comprise a different field-of-view and/or measurement resolution.

At least one of the first sensor and the second sensor may comprise a pressure sensor and/or an air gauge.

At least one of the first sensor and the second sensor may comprise an optical sensor, e.g., an optical level sensor or height sensor.

This may have an advantage that the invention is particularly suitable for use in a lithographic apparatus to measure a height of a substrate, e.g., semiconductor wafer The processor may be adapted to determine a topography of the substrate from the determined height of at least a portion of the substrate.

The signal from the first sensor may correspond to a height of the substrate sensed at a resolution defined by the first sensor footprint.

The signal from the second sensor may correspond to a height of the substrate sensed at a resolution defined by the second sensor footprint.

Beneficially, the invention is applicable to an apparatus wherein the first sensor and the second sensor may measure a height of a substrate with a different resolution.

The apparatus may comprise first and second systems. The first sensor may be a component of the first system. The second sensor may be a component of the second system. The first and second systems may be physically separate.

This may have an advantage that the invention is applicable to an apparatus wherein a first sensor, such as an air gauge sensor which may have a relatively low rate of sensing, may be used separately from a second sensor, such as an optical level sensor which may have a relatively high rate of sensing. In such an example, the air gauge sensor may be located and used separately from the optical level sensor. That is, the air gauge sensor, which may be considerably slower at measuring a height of the substrate than the level sensor, may not be suitable for integration in a lithographic apparatus due to a potential impact on production throughput. Instead the air gauge sensor may be used to measure the height of at least a portion of the substrate in an "off-line" situation, e.g., outside the mass production process and/or outside the lithographic apparatus.

According to a second aspect of the present invention, there is provided a lithographic apparatus comprising the apparatus according to the first aspect.

The lithographic apparatus may comprise adjustment means. The adjustment means may adjust a photolithographic depth-of-focus of a radiation beam on the substrate based upon the determined height of the at least a portion of the substrate.

The photolithographic depth of focus of the radiation beam may be a photolithographic depth of focus of a DUV or an EUV radiation beam.

According to a third aspect of the present invention there is provided a method of measuring a height of at least a portion or area of a substrate, the method comprising the steps of: sensing a height of a substrate over a first portion using a first sensor to produce a first signal, said first sensor having a first sensor footprint; sensing a height of the substrate over a second portion using a second sensor to produce a second signal, said second sensor having a second sensor footprint; normalizing first data corresponding to the first signal with the second sensor footprint to produce a first normalized height data; normalizing second data corresponding to the second signal with the first sensor footprint to produce a second normalized height data; and determining a correction to a measured height of a substrate based on a difference between the first and second normalized height data.

The step of normalizing the first data may include performing convolution of the first data with the second sensor footprint to produce the first normalized height data. The step of normalizing the second data may include convolution of the second data with the first sensor footprint to produce the second normalized height data.

The height of the at least a portion of the substrate may be measured outside a lithographic apparatus. For example, the at least portion of the substrate is measured in a metrology apparatus. Information obtained by measurement using the metrology apparatus may be used for further processing of the substrate, for example at a next processing step in a lithographic exposure apparatus.

Selective measurements (or measurements of selected areas or portions) of the substrate may be performed in the metrology apparatus. That is, critical portions of the substrate may be subject to measurements by a first sensor, which may have a higher measurement resolution, quality, or performance with respect to a second sensor. These selected areas may be different than the areas measured by the second sensor. Areas selectively measured by the first sensor may at least partially overlap with areas measured by the second sensor.

According to a fourth aspect of the present invention, there is provided a computer apparatus for determining a height of a substrate, the apparatus comprising: a memory storing processor readable instructions; and a processor arranged to read and execute instructions stored in said memory; wherein said processor readable instructions comprise instructions arranged to control the computer apparatus to: normalize first data corresponding to a first signal from a first sensor with a second sensor footprint to produce a first normalized height data, wherein the first signal corresponds to a sensed height of a substrate over a first area; normalize second data corresponding to a second signal from a second sensor with the first sensor footprint to produce a second normalized height data, wherein the second signal corresponds to a sensed height of a substrate over the second area; and determine a correction to a measured height of the substrate based on a difference between the first and second normalized height data.

The processor readable instructions may comprise instructions arranged to control the computer to normalize the first data by convolution of the first data with the second sensor footprint to produce the first normalized result.

The processor readable instructions may comprise instructions arranged to control the computer to normalize the second data by convolution of the second data with the first sensor footprint to produce the second normalized height data.

The processor readable instructions may comprise instructions arranged to control the computer to operate adjustment means to adjust a photolithographic depth-of-focus of a radiation beam on the substrate based upon the determined height or a determined topography of at least a portion of the substrate.

BRIEF DESCRIPTION OF THE DRAWINGS

Embodiments of the invention will now be described, by way of example only, with reference to the accompanying schematic drawings, in which.

DETAILED DESCRIPTION

Figure 1:
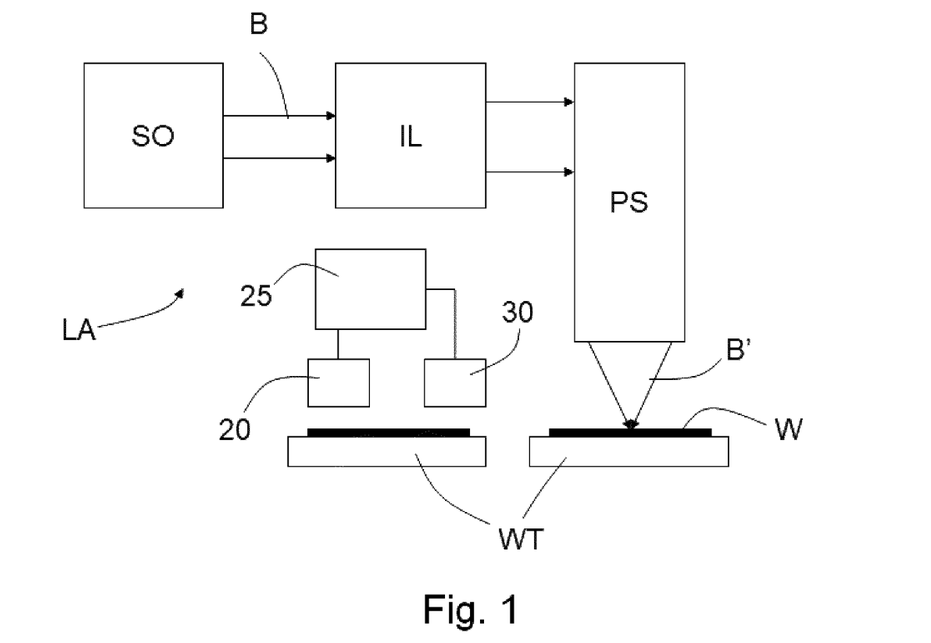
FIG. 1 depicts schematically a lithographic system comprising a lithographic apparatus and embodying the invention.

FIG. 1 shows an example of the invention embodied in a lithographic system comprising a lithographic apparatus LA. The lithographic system may comprise a radiation source SO configured to generate a radiation beam B. Radiation source SO may be configured to generate an extreme ultraviolet (EUV) radiation beam, an ultraviolet (UV) radiation beam, or a deep ultraviolet (DUV) radiation beam. The lithographic apparatus LA comprises an illumination system IL, a projection system PS and a substrate table WT configured to support a substrate W, for example, a semiconductor wafer.

The illumination system IL is configured to condition the radiation beam B before the radiation beam B is incident upon a patterning device (not illustrated). The illumination system IL may include various and different optical elements, e.g., lenses and/or mirrors.

After being conditioned, the radiation beam B may interact with the patterning device. As a result of this interaction, a patterned radiation beam B' is generated. The projection system PS is configured to project the patterned radiation beam B' onto the substrate W. For that purpose, the projection system PS may comprise a plurality of optical elements, e.g., lenses and/or mirrors, which are configured to project the patterned radiation beam B' onto the substrate W held by the substrate table WT. The projection system PS may apply a reduction factor to the patterned radiation beam B', thus forming an image with features that are smaller than corresponding features on the patterning device. For example, a reduction factor of 4 or 8 may be applied.

The substrate W may include previously formed patterns. Where this is the case, the lithographic apparatus LA aligns the image, formed by the patterned radiation beam B', with a pattern previously formed on the substrate W.

The lithographic apparatus may comprise a measuring apparatus for measuring a height or topology of the substrate W. The measuring apparatus may comprise a first sensor 20. The first sensor 20 is arranged for measuring a height of the substrate W. The measuring apparatus may comprise a second sensor 30. The second sensor 30 is also arranged for measuring a height of the substrate W. The first sensor 20 and the second sensor 30 may be communicably coupled to a processor 25. The first sensor 20 is configured to transmit a first signal, or first data corresponding to the first signal, to the processor 25. The first signal may be related to the height of the substrate W, as sensed by the first sensor 20. Similarly, the second sensor 30 is configured to transmit a second signal, or second data corresponding to the second signal, to the processor 25. The second signal may be related to the height of the substrate W, as sensed by the second sensor 30.

The first sensor 20 is configured to sense a height of the substrate W over a first area. The first area corresponds to an area sensed by the first sensor 20, e.g., a sensor footprint of the first sensor 20. The first sensor 20, or a signal from the first sensor 20, may be used to provide or generate data corresponding to a height of the substrate W over at least a portion of an area, e.g., an upper surface area, of the substrate W. In one embodiment, the first sensor 20 may perform a series and/or sequence of measurements of the height of the substrate W at one or more locations of the upper surface of the substrate W. As such, the first sensor 20 may provide, or may be used to provide or generate, first data. The first data may correspond to a height map of the substrate W. The height map of the substrate W may correspond to a topography of the area, e.g., an upper surface area, of the substrate W.

Similarly, the second sensor 30 is configured to sense a height of the substrate W over a second area. The second area corresponds to an area sensed by the sensor 30, e.g., a sensor footprint of the sensor 30. The second sensor 30, or a signal from the second sensor 30, may be used to provide or generate data corresponding to a height of the substrate W over at least a portion of an area, e.g., an upper surface area, of the substrate W. In one embodiment, the second sensor 30 may perform a series and/or sequence of measurements of the height of the substrate W at one or more locations of the upper surface of the substrate W. As such, the second sensor 30 may provide, or may be used to provide or generate, second data. The second data may correspond to a height map of the substrate W. The height map of the substrate W may correspond to a topography of the area, e.g., an upper surface area, of the substrate W.

For a remote sensing apparatus, for example, an optical level sensor or an air gauge, the distance between the apparatus (or sensor) and the target (for example a substrate) plays a role in the measurement quality as generated. That is, the field-of-view, i.e., the angular cone of visibility at the remote sensor, as well as the spatial resolution in the field-of-view determine the quality of the measurement result. In general, the measurement-footprint of a sensor, or sensor footprint, is governed by the field-of-view as well as the measurement resolution, and may be defined as the sensed area at a single moment or instance.

A first sensor, for example the first sensor 20, may be configured to have a first field-of-view and a first measurement resolution, and herewith having a first sensor footprint. A second sensor, for example the second sensor 30, may be configured to have a second field-of-view and a second measurement resolution, and herewith having second sensor footprint. First and second sensors with different field-of-view and/or with different resolution, may have a different sensor footprint. This may result in different measurement results, for example, when both sensors are used to measure the same.

The processor 25 may be configured to receive the first data form the first sensor 20 and to receive the second data from the second sensor 30. In an embodiment according to the invention, the processor 25 is adapted to normalize the first data with the second area, e.g., the footprint of the second sensor 30, to generate a first normalized height measurement data of the measured substrate topology. In addition, the processor 25 is adapted to normalize the second data with the first area, e.g., the footprint of the first sensor 20, to generate a second normalized height measurement data of the measured substrate topology. The processor 25 may be configured to determine a correction to a measured height of the substrate W based on a difference between the first and second normalized height measurement data.

Although FIG. 1 represents an example of the present invention embodied in a lithographic system, it will be appreciated that the invention may be embodied in other apparatuses or systems. For example, the first sensor may be disposed in, or be a component of, a first system or apparatus, and the second sensor may be disposed in, or be a component of, a second system or apparatus. For example, one or both sensors may be embodied in a metrology tool or apparatus, a lithographic apparatus or system, or a shaping apparatus for forming a three-dimensional object on a target surface.

In one example embodiment, the first sensor is disposed within a metrology tool and the second sensor is disposed within a lithographic apparatus. As such, a height of the substrate may be measured by the first sensor before or after the substrate is disposed within the lithographic apparatus, whereas the height of the substrate is measured by the second sensor while the substrate is disposed within the lithographic apparatus.

In further embodiments of the invention, first and second sensors may be different types of sensors. For example, the first and/or second sensor may be a capacitive sensor, an optical sensor, a pressure sensor, air gauge sensor, or an acoustic based sensor, e.g., a scanning acoustic microscope.

In further example embodiments, a footprint of a first sensor is the same or substantially the same as a footprint of a second sensor. The first and second sensors may be the same type of sensors, for example, both the first and second sensors may be air gauge sensors, or both the first and second sensors may be optical sensors.

In a further example embodiment, a footprint of a first sensor is different from a footprint of a second sensor. The first and second sensors may be different types of sensors, for example, the first sensor may be an optical sensor and the second sensor may be an air gauge sensor.

A measurement of the height of the substrate over an area, for example, upper surface area, of the substrate may be described as a convolution of the measured substrate height and a footprint of a sensor used to measure the height. The term 'footprint' is used throughout to describe an area sensed by a sensor. For example, a height measurement from a first sensor, generally termed Sensor A, may be described as a convolution of the measured substrate height and the footprint of the sensor. This can be represented as:

$$\text{SENSOR\_A}_{MEAS} = \text{TOPO} * \text{FP}_{SENSOR\_A}$$

where $\text{SENSOR\_A}_{MEAS}$ is the measurement signal of the height of the substrate over an area of the substrate using Sensor A, TOPO is the height or topography of the substrate, and $\text{FP}_{SENSOR\_A}$ is the sensor footprint of Sensor A.

Similarly, a measurement of the height of a substrate over an area, e.g. upper surface area, of the substrate from a second sensor, generally termed Sensor B can be described as a convolution of the measured substrate height and the sensor footprint of Sensor B. This can be represented as:

$$\text{SENSOR\_B}_{MEAS} = \text{TOPO} * \text{FP}_{SENSOR\_B}$$

where $\text{SENSOR\_B}_{MEAS}$ is the measurement of the height of the substrate over an area of the substrate using Sensor B, TOPO is the height or topography of the substrate, and $\text{FP}_{SENSOR\_B}$ is the sensor footprint of Sensor B.

There may exist a difference between a measured height of the substrate over an area of the substrate measured using Sensor A and a measured height of the substrate over the area of the substrate measured using Sensor B. In an example embodiment, this difference may exist because different types of sensors have been used. In other example embodiments, Sensor A and Sensor B may be the same type of sensor, and differences in measured height may be due to, for example, calibration errors, resolution, field-of-view, and/or sensor drift.

The difference, generally termed DIFF, may be represented by:

$$\text{DIFF} = \text{SENSOR\_A}_{MEAS} - \text{SENSOR\_B}_{MEAS} = (\text{TOPO} * \text{FP}_{SENSOR\_A}) - (\text{TOPO} * \text{FP}_{SENSOR\_B}).$$

As such, it can be seen that the difference, DIFF, is directly impacted by differences between the sensor footprints of Sensor A and of Sensor B.

$\text{SENSOR\_A}_{MEAS}$ corresponds to a height or topography of an area of the substrate such as, for example, a portion of an area of the substrate or substantially all of the substrate. $\text{SENSOR\_B}_{MEAS}$ may correspond to a measurement of the same, or substantially the same area of the substrate as measured with $\text{SENSOR\_A}_{MEAS}$. That is, although Sensor A and Sensor B may have different sensor footprints, the height or topography of the substrate may be measured over substantially the same area of the substrate by Sensor A and Sensor B, i.e., by performing a series or sequence of measurements by the sensors to create a height map of at least a portion of an upper surface of the substrate.

In an example embodiment of the invention, a measurement of the height of the substrate by Sensor A may be performed simultaneously or sequentially from measurement of the height of the substrate by Sensor B. In a further example embodiment of the invention, a measurement of the height of the substrate by Sensor A may be performed at a different time from a measurement of the height of the substrate by Sensor B. For example, a measurement of the height of the substrate by Sensor A may be performed at a first time using a metrology tool and a measurement of the height of the substrate by Sensor B may be performed at a second time, before or after the first time, in a lithographic apparatus.

For example, in embodiments of the invention, Sensor A and Sensor B may be components of the same apparatus, e.g., a lithographic apparatus. In other embodiments falling within the scope of the invention, Sensor A may be a component of a first system or apparatus and Sensor B may be a component of a second system and apparatus. The first and second systems may be physically separated. For example, Sensor A may be a component of a lithographic apparatus and Sensor B may be a component of a metrology tool.

In order to effectively remove an impact on the measured height of the substrate that is due to differences between the sensor footprints of Sensor A and Sensor B, first data corresponding to a signal from Sensor A may be normalized by convolution of the first data with a (typically) two dimensional footprint of Sensor B. As such, normalizing the first data corresponding to a signal from Sensor A by convolution of the first data with the two dimensional footprint of Sensor B can be represented as:

$$\text{SENSOR\_A}_{MEAS}\_FP_{free} = \text{TOPO} * \text{FP}_{SENSOR\_A} * \text{FP}_{SENSOR\_B},$$

where $\text{SENSOR\_A}_{MEAS}\_FP_{free}$ is the Sensor A sensor measurement without the effects of the differences in the sensor footprints, TOPO is the topography or height of the substrate, $\text{FP}_{SENSOR\_A}$ is the sensor footprint of Sensor A, and $\text{FP}_{SENSOR\_B}$ is the sensor footprint of Sensor B.

Similarly, second data corresponding to a signal from Sensor B may be normalized by convolution of the second data with a two dimensional footprint of Sensor A. This can be represented as:

$$\text{SENSOR\_B}_{MEAS\_FPfree} = \text{TOPO} * \text{FP}_{SENSOR\_B} * \text{FP}_{SENSOR\_A},$$

where $\text{SENSOR\_B}_{MEAS\_FPfree}$ is a Sensor B measurement without the effects of the differences in the sensor footprints, TOPO is the topography of the substrate, $\text{FP}_{SENSOR\_A}$ is the sensor footprint of Sensor A, and $\text{FP}_{SENSOR\_B}$ is the sensor footprint of Sensor B.

Accordingly, a difference between the normalized Sensor A data and the Sensor B data is not directly impacted by differences between the footprints of Sensor A and Sensor B. This can be represented as:

$$DIFF_{FPfree} = \text{SENSOR\_A}_{meas\_FPfree} - \text{SENSOR\_B}_{meas\_FPfree}$$
$$= TOPO * FP_{SENSOR\_A} * FP_{SENSOR\_B} -$$
$$TOPO * FP_{SENSOR\_B} * FP_{SENSOR\_A}$$

wherein $DIFF_{FPfree}$ is data representing a measured height of the substrate, minimizing measurement differences introduced by differences between the sensor footprints of Sensor A and Sensor B.

The invention is now further described with reference to FIG. 2, which depicts a particular embodiment of the invention wherein the normalization of the first data and the second data is by means of a mathematical operation of convolution.

Figure 2:
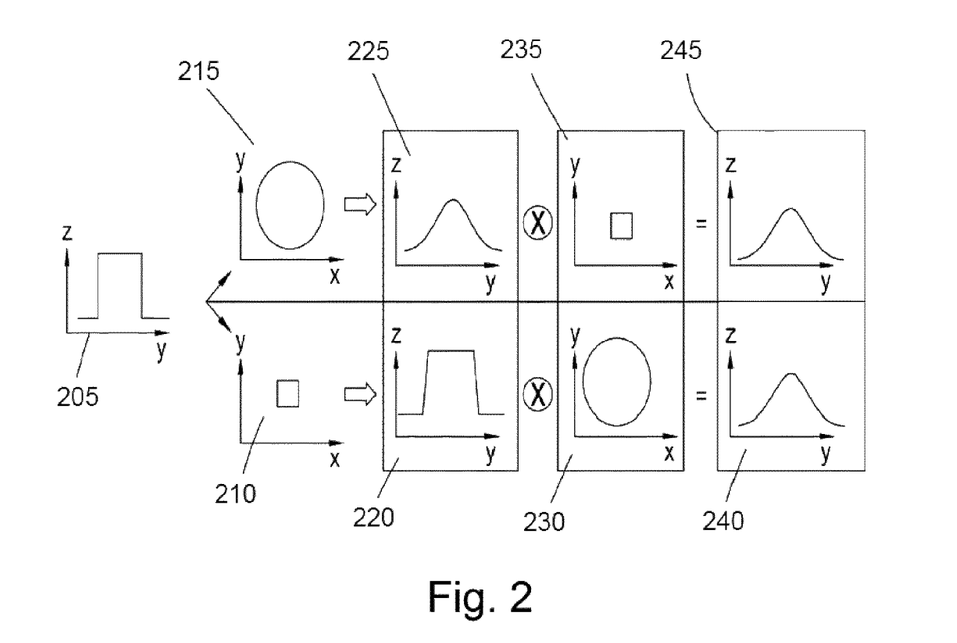
FIG. 2 shows a method of footprint normalization according to an aspect of the present invention.

FIG. 2 depicts a graph 205 illustrating a portion of a topography of a substrate. The 'z axis' represents height, and can be considered a vertical axis. The 'y-axis' represents a direction across a plane of the substrate, i.e., a horizontal direction perpendicular to the vertical axis. As such, for purposes of example only, the graph 205 shows a topographical feature comprising an upwards step function followed by a downwards step function.

Graph 210 depicts a two-dimensional footprint of Sensor A. Graph 215 depicts a two-dimensional footprint of Sensor B. The x-axis of the graphs 210, 215 corresponds to a direction across a plane of the substrate, perpendicular to the y-axis and the z-axis, i.e., a horizontal direction perpendicular to the vertical axis. As can be seen by comparing graphs 210 and 215, the sensor footprints of Sensor A and Sensor B are different. That is, a size and profile of the sensor footprint of Sensor A and the sensor footprint of Sensor B are different. The sensor footprint of Sensor A is, in this example, substantially square shaped. Sensor B has, in this example, a substantially circular footprint with an area significantly larger than that the footprint of Sensor A.

One of skill in the art will appreciate that the sensors footprints shown in the graphs 210, 215 are for illustrative purposes only, and sensors with other footprints, such as with different areas and/or shapes and/or profiles, would also fall within the scope of the present invention.

Graph 220 depicts a response of Sensor A to sensing or measuring the topography shown in Graph 205. Graph 225 depicts a response of Sensor B to sensing or measuring the topography shown in Graph 205. It can be seen that, despite both sensors measuring the same topography, the sensor responses shown in graphs 220 and 225 are different. This difference may be attributed, at least in part, to differences between the footprints of Sensor A and Sensor B.

In order to effectively remove an impact on the measurements of the height of the substrate that may be due to differences between the sensor footprints of Sensor A and Sensor B, the sensor response of Sensor A as shown in Graph 220 is convoluted with the sensor footprint of Sensor B, as shown in graph 230. Similarly, the sensor response of Sensor B as shown in Graph 225 is convoluted with the sensor footprint of Sensor A, as shown in graph 235.

As a result, graph 240 shows the sensor response of the Sensor A normalized with the sensor footprint of Sensor B. Similarly, graph 245 shows the sensor response of Sensor B normalized with the sensor footprint of Sensor A. Notably, the normalized sensor responses are significantly more similar, i.e., a difference between the normalized sensor responses is smaller, than a difference between the sensor responses before normalization. That is, the difference between the normalised data in graphs 240 and 245 is less than the difference between the data in graphs 220 and 225.

The invention is hereafter described in relation to further example embodiments. In particular, the invention is now described in relation to an embodiment for measuring height of a substrate, i.e., the height of an upper surface of the substrate, wherein measurements of the height by Sensor A and Sensor B may be dependent upon processing of the substrate and material composition of the top layers of the substrate. Such process dependency may be caused by stack interference effects, and is known in the field as Height Process Dependency (HPD). HPD may be noticed as a deviation between a measured height of the substrate and an actual height of the substrate, due to composition or process sensitivity of the used sensor. Thus, a difference between a height of the substrate measured using Sensor A and a height of the substrate measured using Sensor B may be, at least in part, a representative of the HPD.

Figure 3:
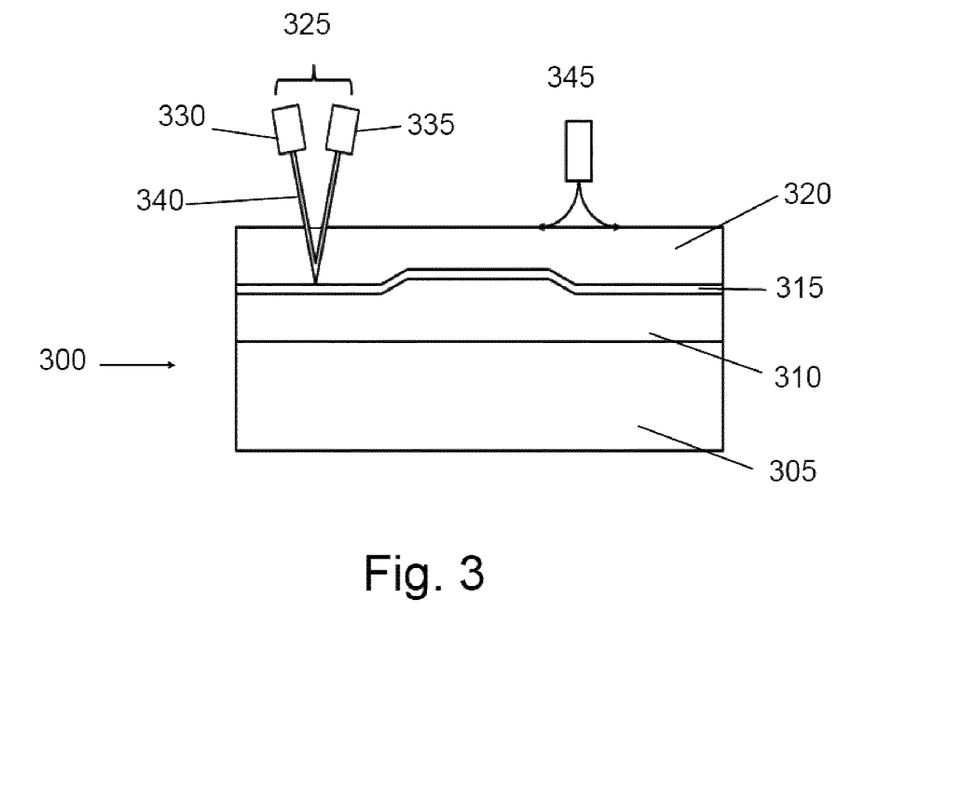
FIG. 3 depicts a substrate and a representation of two sensors for measuring a height of the substrate.

FIG. 3 depicts a representation of measurements of a height of a substrate 300 performed using different types of sensor. While FIG. 3 shows two types of sensors simultaneously measuring the height of a substrate, this is for illustrative purposes only. One of skill in the art will appreciate that in other preferred embodiments, measurements of the height of a substrate by different sensors may be performed at different times, and using different and/or separate systems or apparatus.

It will appreciated by the skilled person that more than two sensor may be used for the measurements. The invention is not limited to two sensors.

It will be understood by one of skill in the art that the term 'substrate' may relate to a semiconductor substrate. Furthermore, the term 'substrate' is used in a general sense to broadly include a substrate, such as a semiconductor wafer, which may be at any stage in a lithographic process. For example, the substrate may refer to a semiconductor substrate, e.g., a silicon substrate, comprising one or more layers. The one or more layers may comprise, for example, silicon dioxide layers of various/varying levels of doping. The one or more layers may comprise, for example, metal layers, such as copper layers. The one or more layers may comprise, for example, a layer of photoresistive material, e.g., a positive or negative photosensitive material. As such, the term 'substrate' will be understood to include a semiconductor wafer at any stage in a semiconductor manufacturing process.

It will be understood that the height of the substrate may be a height relative to another feature or component of a device, apparatus or system. For example, one embodiment the height of the substrate may be a height relative to the lithographic apparatus, or any feature of the lithographic apparatus. For example the height may be a height relative to the wafer table WT. The height may be a height relative to the first sensor and/or the second sensor. The height may be a vertical height.

In another example embodiment, the height of the substrate may be a height relative to a metrology tool, system or apparatus, or a component thereof.

Furthermore, one of skill in the art will also appreciate that the height may be a height of an upper surface of the substrate. The height may be a height, or an approximation of a height, of an upper surface of the substrate. The upper surface may be precisely the upper surface, or may be the upper surface as measured by the first and/or second sensor, which may in effect be a height within the substrate, as described in more detail below.

In the example shown in FIG. 3, the substrate 300 comprises a silicon substrate 305 comprising a silicon dioxide layer 310. As such, the substrate 300 shown represents a typical example of a processed semiconductor wafer.

Disposed within the substrate is a deposited layer 315, e.g., a Bottom Anti-Reflective Coating (BARC), above which a top layer 320, e.g., a photoresist layer, has been deposited, as is typically used in a photolithographic process. In the example shown, an upper surface of the deposited layer 315 has a substantially a non-planar profile. That is, the deposited layer 315 has a non-planar topography. In contrast, an upper surface of the top layer 320 that may be spun, or otherwise deposited on the deposited layer 315 has a substantially flat upper surface relative to the deposited layer 315. That is, although the upper surface of the top layer 320 may not be entirely flat and may, for example, still have a topography at least in part defined by a topography of an underlying stack, an upper surface of the top layer 320 may be substantially more flat/planar than that of the deposited layer 315. In another example, a topography of the upper surface of the top layer 320 may be at least in part defined by a warpage of the underlying substrate 305.

By means of example only, in FIG. 3 Sensor A is embodied as an optical level sensor 325, or optical height sensor. The optical level sensor 325 comprises a light source 330 and an optical sensor 335. The term 'light' is used in a general sense and should not be construed as being limited to visible light, but instead more generally to radiation including, for example, ultra violet light and/or infrared light. In use, the light source 330 provides one or more beams of light 340, which are incident upon the substrate 300. The one or more beams of light 340 may be, for example monochromatic, polychromatic, polarized, unpolarised, broadband, continuous wave (cw), and/or pulsed. The one or more beams of light 340 may comprise ultraviolet light and/or visible light and/or infrared light. The optical sensor 335 detects a reflection of the one or more beams of light 340. A signal from the optical level sensor 325 may be used to determine, or approximate, a distance between the substrate 300 and the optical level sensor 325. As such, a height of the substrate 300, may be measured.

In one example use case, the optical level sensor 325 is used to measure a height of the substrate 300, e.g., a vertical position of an uppermost surface of the substrate 300, at defined points across the substrate 300 after it has been loaded into an apparatus, e.g., a lithographic apparatus LA. The uppermost surface of the substrate 300 may be an upper surface of a photoresist layer. Such a set of measurements may be stored, and collectively may form a map of the topography of at least a portion of the substrate 300, i.e., a height map. During exposure of the substrate 300, the height map may be used to ensure that each portion of the substrate 300 lies within a focal plane of a projection lens PS. The height of the substrate table WT bearing the substrate (W, 300) may be adjusted, e.g., adjusted continuously, during exposure of portions of the substrate 300.

By means of example only, Sensor B is embodied in FIG. 3 as an air gauge sensor 345. The air gauge sensor 345 may provide an additional means to measure the height of the substrate 300.

The air gauge sensor 345, which is a non-optical sensor, may provide a more accurate indication of a height of the substrate 300 than is achievable using the optical level sensor 325. As such, the air gauge sensor 345 may be used to complement and/or calibrate the optical level sensor 325, and to correct errors in height measurements made using the optical level sensor 325, such as errors introduced by process dependencies.

In use, the air gauge sensor 345 may be considerably slower than the optical level sensor 325, and thus use of such an air gauge sensor may be highly time consuming. In an exemplary use case, an air gauge sensor 345 measures a surface of a substrate approximately 10 times slower than the optical level sensor 325. As such, although FIG. 3 shows both the optical level sensor 325 and the air gauge sensor 345 measuring a height of a substrate 300, in alternative embodiments falling within the scope of the present invention, the air gauge sensor 345 may be located and used separately from the optical level sensor 325. That is, the air gauge sensor 345, which is considerably slower at measuring a height of the substrate 300 than the optical level sensor 325, may not be suitable for integration in the lithographic apparatus LA due to a potential impact on production throughput. Instead the air gauge sensor 345 may be used to measure the height of at least a portion of the substrate 300 in an "off-line" situation, e.g., outside the mass production process and/or outside the lithographic apparatus LA. Height measurements obtained with the air gauge sensor 345 may be used, for example, to obtain a map of the topography of the substrate 300 to be used in conjunction with measurements obtained with the optical level sensor 325, such as measurements obtained with the optical level sensor 325 at a later time.

As a result of height measurements made using the air gauge sensor 345 in conjunction with height measurements made using the optical level sensor 325, a focusing of a radiation beam from a projection lens onto the substrate 300 may be controlled, thus ensuring an appropriate photolithographic depth-of-focus for patterning the substrate 300. For example, a height of the substrate table WT bearing the substrate 300 may be adjusted, e.g., adjusted continuously or intermittently, during exposure (not shown) of portions of the substrate 300. The apparatus LA may comprise an adjustment means to adjust a height of the substrate table WT to control the photolithographic depth-of-focus for patterning the substrate 300. The adjustment means may be controlled by a processor in response to height measurements made using the air gauge sensor 345 in conjunction with height measurements made using the optical level sensor 325.

In contrast to measurements made using the optical level sensor 325, an upper surface of the substrate 300 as measured by the air gauge sensor 345 corresponds to an upper surface of the photoresist 320.

Measurements of an upper surface of the substrate 300 as measured by the optical level sensor 325 may vary significantly from measurements made by the air gauge sensor 345.

That is, a known problem with optical level sensors is that different substrates, and different parts of a substrate, may interact differently with the beams of radiation from the light source of an optical level sensor. Measurements of the height of the substrate obtained by an optical level sensor may be subject to process-dependent effects and therefore are not always representative of a true height of the substrate. For example, as shown in FIG. 3 for purposes of example only, the one or more beams of light 340 may propagate through the top layer 320 and be reflected off an underlying layer, for example, the deposited layer 315.

In summary, an incident beam of light from the optical level sensor may interact in a complex manner with the materials and patterns present within the substrate, such that the incident beam of light may undergo various reflections and/or deflections and/or refractions at the successive layer-interfaces of the substrate, rather than only the top surface of the substrate. Consequently, a beam of light incident upon the substrate may result in multiple individual beams exiting the substrate, and subsequently detected by the level sensors, leading to inaccuracies in height measurements.

As such, measurements of the height of the substrate 300, i.e., the height of an upper surface of the substrate 300, may be dependent upon processing of the substrate 300, and thus may exhibit HPD.

While the impact of HPD may be reduced, for example by the use of an optimized light source in the optical level sensor, HPD may remain a dominant contributor to errors in measurements of the height of a substrate.

Figure 4A:
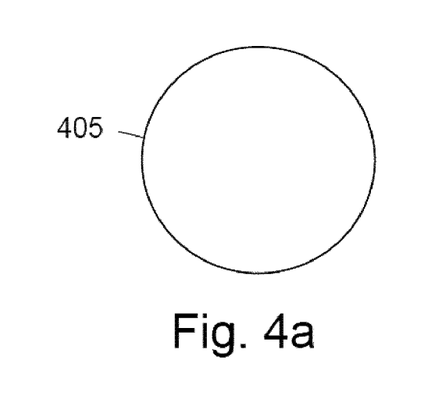
FIG. 4a shows an example sensor footprint of an air-gauge sensor.
Figure 4B:
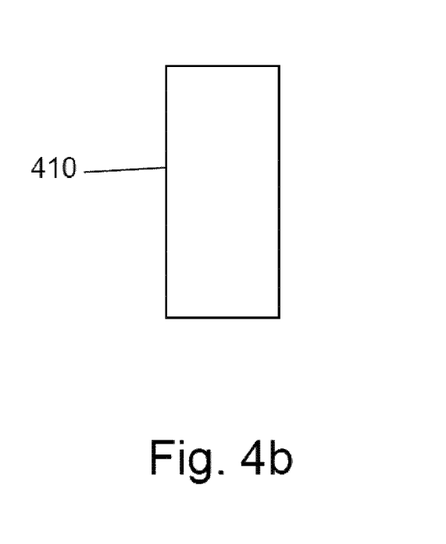
FIG. 4b shows an example sensor footprint of an optical sensor.

FIGS. 4a and 4b depict footprint examples of different sensors. FIG. 4a depicts an example of a footprint 405 of an air gauge sensor. In an example embodiment, the footprint 405 is substantially circular, and may have a diameter in the range of 1 to 10 mm.

In contrast, FIG. 4b depicts an exemplary footprint 410 of an optical level sensor. The footprint 410 as illustrated in FIG. 4b is substantially rectangular shaped, although other shapes, such as squares, trapezoids, circles, and parallelograms are also practicably feasible. The specific area and shape of the sensor footprint of the optical level sensor may be defined by characteristics and features of the sensor used. Notably, in the example embodiments shown, an area of the sensor footprint of the optical level sensor may be approximately an order of magnitude smaller than an area of the sensor footprint of the air gauge sensor. In other embodiments, an area of the sensor footprint of the optical level sensor may be in the region of several times smaller than an area of the sensor footprint of the air gauge sensor. Thus, there may exist a significant disparity between an area of the sensor footprint 410 of the optical level sensor and an area of the footprint 405 of the air gauge sensors.

Figure 5:
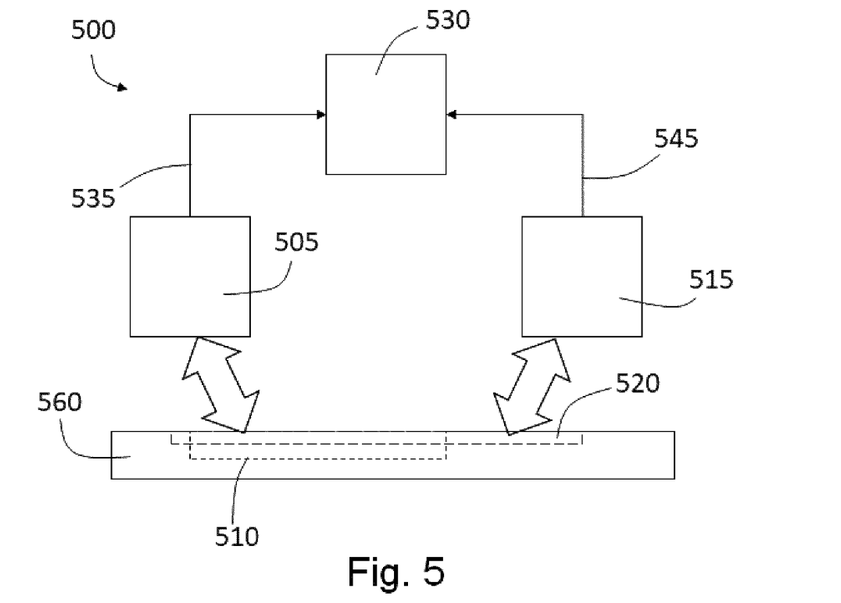
FIG. 5 illustrates an apparatus according to an embodiment of the invention.

A difference between the sensor footprints of different sensors is further illustrated in FIG. 5, which depict an apparatus 500 according to an embodiment of the invention. The apparatus 500 configured for measuring a characteristic of substrate, e.g., a height of a substrate. The apparatus 500 is able to effectively remove the impact on the measurement that is due to the sensor footprints of first and second sensors, as described in more detail below.

The characteristic of the substrate, as measured by the apparatus 500, may be an optical parameter of the substrate.

The substrate may be subject to processing in an apparatus, e.g., a lithographic apparatus LA.

The apparatus 500 comprises a first sensor, Sensor A 505 with a sensor footprint having a first area 510, for sensing, for example, a height of a substrate 560. The apparatus also comprises a second sensor, Sensor B 515 with a sensor footprint having a second area 520 for sensing, for example, a height of the substrate 560. The apparatus also comprises a processor 530. The processor 530 may comprise a microprocessor, a computer, software or the like. The processor 530 may be communicably coupled to the sensors 505, 515, such that a signal or data from the sensors 505, 515 may be used, and thus processed, by the processor 530.

FIG. 5 depicts Sensor A 505 configured to perform one or more measurements of, for example, a height of the substrate 560, wherein Sensor A has a sensor footprint corresponding to a first area 510. A first signal 535 from Sensor A 505, may be used to provide or generate data corresponding to a height of the substrate 560 over at least a portion of an area, e.g., an upper surface area, of the substrate 560. For example, the Sensor A 505, or the first signal 535 from Sensor A 505, may be used to provide data corresponding to a height of the substrate 560 over at least a substantial portion of the area, e.g., an upper surface area, of the substrate 560. In one embodiment, the Sensor A 505 may perform a series and/or sequence of measurements of the height of the substrate 560 at one or more locations of the upper surface of the substrate 560. As such, the Sensor A may provide, or may be used to provide or generate, first data. The first data may correspond to a height map of the substrate 560. The height map of the substrate 560 may correspond to a topography of the measured area, e.g., an upper surface area, of the substrate.

In addition, FIG. 5 depicts Sensor B 515 configured to perform one or more measurements of, for example, a height of the substrate 560, wherein Sensor B has a sensor footprint corresponding to a second area 520. A second signal 545 from Sensor B 515, may be used to provide or generate data corresponding to a height of the substrate 560 over at least a portion of an area, e.g., an upper surface area, of the substrate 560. For example, Sensor B 515, or a signal from Sensor B 515, may be used to provide data corresponding to a height of the substrate 560 over at least a substantial portion of the area, e.g. upper surface area, of the substrate 560. In one embodiment, the Sensor B 515 may perform a series and/or sequence of measurements of the height of the substrate 560 at one or more locations of the upper surface of the substrate 560. As such, the Sensor B may provide, or may be used to provide or generate, second data. The second data may correspond to a height map of the substrate 560. The height map of the substrate 560 may correspond to a topography of the measured area, e.g. an upper surface area, of the substrate.

Measurement of the height of the first area 510 may be performed simultaneously or sequentially from measurement of the second area 520. That is, the measurement(s) depicted in FIG. 5 may be performed before or after each other, or at the same time.

Furthermore, in other embodiments falling within the scope of the present invention, the Sensor A 505 may be a component of a first system and Sensor B 515 may be a component of a second system, the first and second systems being physically separated. As such, at least one of the measurements may be performed in an "off-line" situation, such as not as part of a production process or lithographic process. That is, the first and/or second systems may be distinct from a lithographic apparatus, i.e., not part of the lithographic apparatus.

The processor 530 may be adapted to receive the first signal 535 or data from Sensor A 505. The processor 530 may be adapted to receive the second signal 545 or data from Sensor B 515.

In an embodiment, the processor 530 is configured to receive data of one or both sensors via a storage medium, e.g., a portable storage medium or an information or data server. Thus, the processor 530 may not be connected with one or both sensors.

The processor 530 is configured to normalize first data corresponding to the first signal 535 from the Sensor A 505 with the sensor footprint of the Sensor B to produce a first normalized result. The processor 530 is configured to normalize second data corresponding to the second signal 545 from the Sensor B 515 with the sensor footprint of the Sensor A to produce a second normalized result.

The processor 530 may be adapted to determine a height of at least a portion of the substrate 560 based on at least a difference between the first and second normalized results. Notably, the determined height of at least a portion of the substrate 560 is not directly impacted by differences between the first area 510, i.e., the footprint of Sensor A, and the second area 520, i.e., the footprint of Sensor B, and instead only, or at least, the process dependent errors in the measurement of the height may remain.

The determined height of at least a portion of the substrate 560 can be used, for example to adjust a photolithographic depth-of-focus of a radiation beam on the substrate. That is, the height of the substrate table WT bearing the substrate 560 may be adjusted, e.g., adjusted continuously, during exposure of portions of the substrate 560 based upon the determined height of the at least a portion of the substrate. The photolithographic depth-of-focus of the radiation beam may be a photolithographic depth of focus of a DUV or an EUV radiation beam.

In a typical embodiment of the apparatus of FIG. 5, Sensor A 505 is an optical level sensor and the Sensor B 515 is an air gauge sensor. However, it will be appreciated that the apparatus, and associated method, are described with reference to an air gauge sensor and an optical level sensor for measuring substrate height for purposes of example only. One will appreciate that the invention is equally applicable to other sensors such as, for example, level sensors of a feed-forward control system, such as that implemented in the ASML 'YieldStar' metrology tool, and/or HMI (Hermes Microvision, Inc) metrology systems.

In addition, one skilled in the art will appreciate that the invention may be applied to sensors measuring a characteristic of a substrate different from a topography, for example, an optical parameter of the substrate.

Additionally, the first and/or second sensor may be a capacitive sensor, an optical sensor, a pressure sensor, air gauge sensor, or an acoustics based sensor, e.g., a scanning acoustic microscope.

As previously described, a measurement of the topography of a substrate can be described as a convolution of the measured substrate topography and the footprint of the sensor used to measure the topography. For example, in the embodiment of FIG. 3, Sensor A is an optical level sensor 325. A measurement result of the topography of the substrate from the Sensor A (e.g., optical level sensor) may be described as a convolution of the measured substrate topography and the sensor footprint of the Sensor A (e.g., optical level sensor). This can be generally represented as:

$$A_{meas} = \text{TOPO} * FP_A,$$

where $A_{meas}$ is the measurement of the topography of the substrate using the Sensor A, e.g., an optical level sensor, TOPO is the topography of the substrate, and $FP_A$ is the sensor footprint of the Sensor A, e.g., the optical level sensor.

Similarly, in the example embodiment of FIG. 3, Sensor B is an air gauge sensor 345. A measurement from the Sensor B (e.g., air gauge sensor) may be described as a convolution of the measured substrate topography and the footprint of the Sensor B (e.g., air gauge sensor). This can be generally represented as:

$$B_{meas} = \text{TOPO} * FP_B,$$

where $B_{meas}$ is the measurement of the topography of the subtract using a Sensor B, e.g., an air gauge sensor, TOPO is the topography of the substrate, and $FP_B$ is the sensor footprint of the Sensor B, e.g., the air gauge sensor.

The sensor footprint of the Sensor A and/or the Sensor B may be scaled or defined based upon characteristics of the sensor used. For example, a sensitivity of the sensor over an area defined by the sensor footprint of the sensor may vary. By means of example only, a footprint of the air gauge sensor, which may comprise a substantially circular footprint 405 as shown in FIG. 4a, may comprise areas in which a sensitivity of the sensor, e.g., a sensor response, differs from that of other areas of the footprint 405. In one example, a footprint of a sensor may be defined by a function. The function may be a Gaussian function, or the like. In a further example, a footprint of a sensor may be substantially ring-shaped.

As previously described, a difference between a height of the substrate measured using an air gauge sensor and a height of the substrate measured using an optical level sensor is, or may comprise the HPD. The difference in measured height may be represented by:

$$\text{DIFF}_{AB} = A_{meas} - B_{meas} = (\text{TOPO} * FP_A) - (\text{TOPO} * FP_B).$$

As such, it can be seen that the difference is directly impacted by differences between the sensor footprints of the Sensor A and of the Sensor B.

In order to effectively remove the impact on the measured height that is due to differences between the sensor footprints of Sensor A, e.g., the optical level sensor, and Sensor B, e.g., the air gauge sensor, a first data corresponding to a first signal from the Sensor A can be normalized by convolution of the first data with a two dimensional footprint of the Sensor B. It will be appreciated that, although in the present example embodiment Sensor A may be an optical level sensor and Sensor B may be an air gauge sensor, the invention is equally applicable to other sensor types. As such, normalizing the first data corresponding to a first signal from the Sensor A by convolution of the first data with a two dimensional footprint of the Sensor B can be represented as:

$$A_{meas\_FPfree} = \text{TOPO} * FP_A * FP_B,$$

where $A_{meas\_FPfree}$ is the measurement of the topography of the substrate using Sensor A without the effects of the sensor footprint, TOPO is the topography of the substrate, $FP_A$ is the footprint of the Sensor A, and $FP_B$ is the footprint of the Sensor B.

Similarly, second data corresponding to a second signal from the Sensor B can be normalized by convolution of the second data with a two dimensional footprint of the Sensor A. This can be represented as:

$$B_{meas\_FPfree} = \text{TOPO} * FP_B * FP_A,$$

where $B_{meas\_FPfree}$ is the measurement of the topography of the substrate using Sensor B without the effects of the sensor footprint, TOPO is the topography of the substrate, $FP_B$ is the footprint of the Sensor B, and $FP_A$ is the footprint of the Sensor A.

Thus, the data corresponding to the signals from the two sensors are cross-convoluted with the two dimensional footprints of each other.

Accordingly, a difference between the normalized signal of Sensor A and the normalized signal of sensor B is not directly impacted by differences between the sensor footprints of the Sensor A and of the Sensor B. Process dependencies may still remain. The difference may be represented as:

$$\text{DIFF}_{FPfree} = A_{meas\_FPfree} - B_{meas\_FPfree} = \text{TOPO} * FP_A * FP_B - \text{TOPO} * FP_B * FP_A,$$

wherein $\text{DIFF}_{FPfree}$ is a signal (or data corresponding to such a signal) that may comprise height process dependency effects, but may have minimized errors that are introduced by differences between the footprints of the two sensors, e.g., the air gauge sensor and of the optical level sensor.

Figure 6:
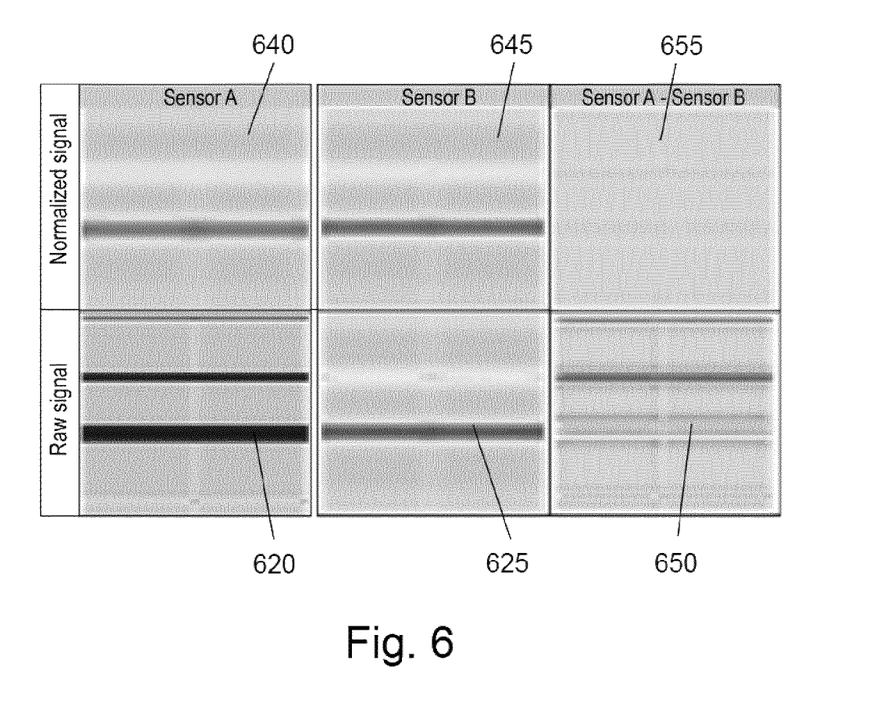
FIG. 6 shows example results of measurements of substrate height, and subsequent processing of the measurements according to the method depicted in FIG. 2.

Experimental data relating to the above-described apparatus and methods is provided in FIG. 6. FIG. 6 shows a first height map 620 of a portion of a substrate, measured using Sensor A. In the example shown, Sensor A is an optical level sensor, although as described above, this is for purposes of example only and another sensor type may be used. Also shown in a second height map 625 of the same portion of the substrate, measured using a Sensor B. In the example shown, Sensor B is an air gauge sensor, although as described above, this is for purposes of example only and another sensor type may be used. Sensor A has a different footprint from that of Sensor B. In each map shown in FIG. 6, a height of the substrate is indicated by a degree of shading, i.e., dark-shaded areas are of a different height to light-shaded areas.

By comparing the first height map 620 and the second height map 625, it can be seen that there are significant differences between the height maps. These differences are illustrated in diagram 650, which depicts a difference between the first height map 620 and the second height map 625. In diagram 650, darker shading represents more significant differences, whereas lighter shading represents less significant differences. The cause of these differences may be attributed, at least in part, to differences between the sensor footprints.

A third height map 640 shows the data corresponding to the first height map 620 normalized using the sensor footprint of the Sensor B, e.g., the footprint of the air gauge sensor. Similarly, a fourth height map 645 shows the data corresponding to the second height map 625 normalized using the sensor footprint of the Sensor A, e.g., the optical level sensor.

By comparing the third height map 640 and the fourth height map 645, it can be seen that there are less significant differences between the height maps 640, 645 than there are between the first height map 620 and the second height map 625. These differences are illustrated in diagram 655, which depicts a difference between the third height map 640 and the fourth height map 645.

That is, by implementing the method according to the present invention, the impact of differences between the sensor footprints of the Sensor A and Sensor B on measurements of the height of a substrate may be reduced.

As mentioned above, the invention may be applied to minimize differences in measurement results due to differences in sensor footprints when measuring a characteristic of a substrate, which may be different than a topography of the substrate. The characteristic may be an optical parameter, topography, but may as well be surface roughness or a magnetic or electrical parameter.

The invention can be implemented as a computer apparatus for determining a height of a substrate for processing in an apparatus. For example, the processor 530 may be a computer apparatus. Such a computer apparatus may comprise a memory storing processor readable instructions and a processor arranged to read and execute instructions stored in said memory. The computer apparatus may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

The processor readable instructions may comprise instructions arranged to control the computer apparatus to normalize first data corresponding to a first signal from a first sensor with a second area to produce a first normalized result, wherein the first signal corresponds to a sensed height of a substrate over a first area. The processor readable instructions may comprise instructions arranged to normalize second data corresponding to a second signal from a second sensor with the first area to produce a second normalized result, wherein the second signal corresponds to a sensed height of a substrate over the second area. The processor readable instructions may comprise instructions arranged to determine a correction to a measured height of the substrate based on a difference between the first and second normalized results.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography. Applications may also include, the manufacturing of three-dimensional models by rapid prototyping (sometimes referred to as 3D printing, or additional production, or direct digital production).

While specific embodiments of the invention have been described above, it will be appreciated that the invention may be practiced otherwise than as described. Aspects of the invention are set out in the clauses below.

1. An apparatus for measuring a height of a substrate, the apparatus comprising:
a first sensor configured to measure a first height of the substrate over a first area, the first sensor comprising a first sensor footprint; a second sensor configured to measure a second height of the substrate over a second area, the second sensor comprising a second sensor footprint; a processor adapted to: normalize a first data corresponding to a first signal from the first sensor with the second sensor footprint to produce a first normalized height data, said first signal corresponds to measured first height; and
normalize second data corresponding to a second signal from the second sensor with the first sensor footprint to produce a second normalized height data, said second signal corresponds to measured second height.

2. The apparatus of clause 1, wherein the processor is adapted to normalize the first data by convolution of the first data with the second sensor footprint to produce the first normalized height data, and to normalize the second data by convolution of the second data with the first sensor footprint to produce the second normalized height data.

3. The apparatus of clause 1 or 2, wherein the processor is adapted determine a correction to a measured height of the substrate based on a difference between the first normalized height data and the second normalized height data.

4. The apparatus of any preceding clause, wherein at least one of a size and profile of the first sensor footprint and the second sensor footprint is different.

5. The apparatus of any preceding clause wherein the at least one of the first sensor and the second sensor comprises a pressure sensor and/or an air gauge.

6. The apparatus of any preceding clause wherein at least one of the first sensor and the second sensor comprises an optical sensor.

7. The apparatus of any preceding clause wherein the processor is adapted to determine a topography of the substrate from the determined height of at least a portion of the substrate.

8. The apparatus of any preceding clause, wherein the first signal from the first sensor corresponds to a height of the substrate sensed at a resolution defined by the first footprint, and the second signal from the second sensor corresponds to a height of the substrate sensed at a resolution defined by the second footprint.

9. The apparatus of any preceding clause comprising first and second systems, the first sensor being a component of the first system and the second sensor being a component of the second system, and the first and second systems being physically separate.

10. A lithographic apparatus comprising the apparatus of any of clauses 1 to 8.

11. The lithographic apparatus of clause 10, comprising adjustment means to adjust a photolithographic depth of focus of a radiation beam on the substrate based upon the determined height of the at least a portion of the substrate.

12. The lithographic apparatus of clause 11, wherein the photolithographic depth of focus of the radiation beam is a photolithographic depth of focus of a DUV or an EUV radiation beam.

13. A method of measuring a height of at least a portion of substrate, the method comprising the steps of: sensing a height of a substrate over a first area using a first sensor to produce a first signal; sensing a height of the substrate over a second area using a second sensor to produce a second signal; normalizing first data corresponding to the first signal with the second area to produce a first normalized result; normalizing second data corresponding to the second signal with the first area to produce a second normalized result; and determining a correction to a measured height of a substrate based on a difference between the first and second normalized results.

14. The method of clause 13, wherein the step of normalizing the first data includes performing convolution of the first data with the second sensor footprint to produce the first normalized height data, and the step of normalizing second data includes convolution of the second data with the first area to produce the second normalized height data.

15. The method of clauses 13 or 14, wherein the height of the at least a portion of the substrate is measured outside a lithographic apparatus.

16. A computer apparatus for determining a height of a substrate, the apparatus comprising: a memory storing processor readable instructions; and a processor arranged to read and execute instructions stored in said memory; wherein said processor readable instructions comprise instructions arranged to control the computer apparatus to: normalize first data corresponding to a first signal from a first sensor with a second sensor footprint to produce a first normalized result, wherein the first signal corresponds to a sensed height of a substrate over a first area; normalize second data corresponding to a second signal from a second sensor with the first sensor footprint to produce a second normalized result, wherein the second signal corresponds to a sensed height of a substrate over the second area; and determine a correction to a measured height of the substrate based on a difference between the first and second normalized results.

17. The computer apparatus of clause 16, wherein the processor readable instructions comprise instructions arranged to control the computer to normalize the first data by convolution of the first data with the second area to produce the first normalized result and to normalize the second data by convolution of the second data with the first area to produce the second normalized result.

18. The computer apparatus of clause 16 or 17, wherein the processor readable instructions comprise instructions arranged to control the computer to operate adjustment means to adjust a photolithographic depth of focus of a radiation beam on the substrate based upon the determined height or a determined topography of at least a portion of the substrate.

19. The apparatus of clause 3, wherein the processor is adapted to determine a topography of at least a portion of the substrate from the determined correction and at least one of the measured first height, measured second height, first normalized height data, and second normalized height data.

20. A measurement apparatus comprising:
a first sensor having a first sensor footprint, said first sensor configured to measure a characteristic of a substrate, and generating a first signal;
a second sensor having a second sensor footprint, said second sensor configured to measure the characteristic of the substrate, and generating a second signal; and
a processor configured to: normalize by convolution a first data corresponding to the first signal with the second sensor footprint to produce a first normalized data, said first signal corresponds to measured first characteristic; and
normalize by convolution a second data corresponding to the second signal with the first sensor footprint to produce a second normalized data, said second signal corresponds to measured second characteristic.

21. The apparatus of clause 20, wherein at least one of the first and second sensor is a capacitive sensor, an optical sensor, a pressure sensor, an acoustic sensor, or a combination of preceding sensors (a hybrid sensor).

22. A method of measuring a characteristic of at least a portion of a substrate, the method comprising the steps of:
sensing a characteristic of a substrate over a first portion using a first sensor to produce a first signal, said first sensor having a first sensor footprint;
sensing a characteristic of the substrate over a second portion using a second sensor to produce a second signal, said second sensor having a second footprint;
normalizing first data corresponding to the first signal with the second footprint to produce a first normalized characteristic data;
normalizing second data corresponding to the second signal with the first footprint to produce a second normalized characteristic data; and
determining a correction to a measured characteristic of a substrate based on a difference between the first and second normalized characteristic data.

23. The method of clause 22, wherein the step of normalizing the first data includes performing convolution of the first data with the second sensor footprint to produce the first normalized characteristic data, and the step of normalizing second data includes convolution of the second data with the first sensor footprint to produce the second normalized characteristic data.

24. The apparatus of any of clause 1 to 9, wherein the first area and the second area at least partly overlap.

The descriptions above are intended to be illustrative, not limiting. Thus it will be apparent to one skilled in the art that modifications may be made to the invention as described without departing from the scope of the claims set out below.

The invention claimed is:

1. An apparatus for measuring a height of at least a portion of a substrate, the apparatus comprising:
   a first sensor configured to measure a first height of the substrate over a first area, the first sensor comprising a first sensor footprint;
   a second sensor configured to measure a second height of the substrate over a second area, the second sensor comprising a second sensor footprint; and
   a processor adapted to:
      normalize a first data corresponding to a first signal from the first sensor with the second sensor footprint to produce a first normalized height data, wherein the first signal corresponds to measured first height; and
      normalize a second data corresponding to a second signal from the second sensor with the first sensor footprint to produce a second normalized height data, wherein the second signal corresponds to measured second height.

2. The apparatus of claim 1, wherein the processor is adapted to normalize the first data by convolution of the first data with the second sensor footprint to produce the first normalized height data, and to normalize the second data by convolution of the second data with the first sensor footprint to produce the second normalized height data.

3. The apparatus of claim 1, wherein the processor is adapted to determine a correction to a measured height of the substrate based on a difference between the first normalized height data and the second normalized height data.

4. The apparatus of claim 3, wherein the processor is adapted to determine a topography of at least a portion of the substrate from the determined correction and at least one of the measured first height, measured second height, first normalized height data, and second normalized height data.

5. The apparatus of claim 1, wherein at least one of a size and a profile of the first sensor footprint and the second sensor footprint is different.

6. The apparatus of claim 1, wherein the at least one of the first sensor and the second sensor comprises a pressure sensor and/or an air gauge.

7. The apparatus of claim 1, wherein at least one of the first sensor and the second sensor comprises an optical sensor.

8. The apparatus of claim 1, wherein the first signal from the first sensor corresponds to a height of the substrate sensed at a resolution defined by the first sensor footprint, and the second signal from the second sensor corresponds to a height of the substrate sensed at a resolution defined by the second sensor footprint.

9. The apparatus of claim 1, comprising a first system and a second system, the first sensor being a component of the first system and the second sensor being a component of the second system, and the first and second systems being physically separate.

10. A lithographic apparatus comprising an apparatus for measuring a height of at least a portion of a substrate, the apparatus comprising:
    a first sensor configured to measure a first height of the substrate over a first area, the first sensor comprising a first sensor footprint;
    a second sensor configured to measure a second height of the substrate over a second area, the second sensor comprising a second sensor footprint; and
    a processor adapted to:
       normalize a first data corresponding to a first signal from the first sensor with the second sensor footprint to produce a first normalized height data, wherein the first signal corresponds to measured first height; and
       normalize a second data corresponding to a second signal from the second sensor with the first sensor footprint to produce a second normalized height data, wherein the second signal corresponds to measured second height.

11. The lithographic apparatus of claim 10, comprising adjustment means to adjust a photolithographic depth of focus of a radiation beam on the substrate based upon the determined height of the at least a portion of the substrate.

12. The lithographic apparatus of claim 11, wherein the photolithographic depth of focus of the radiation beam is a photolithographic depth of focus of a DUV or an EUV radiation beam.

13. A method of measuring a height of at least a portion of a substrate, the method comprising the steps of:
    sensing a height of the substrate over a first portion using a first sensor to produce a first signal, the first sensor having a first sensor footprint;
    sensing a height of the substrate over a second portion using a second sensor to produce a second signal, the second sensor having a second sensor footprint;
    normalizing a first data corresponding to the first signal with the second sensor footprint to produce a first normalized height data;
    normalizing a second data corresponding to the second signal with the first sensor footprint to produce a second normalized height data; and
    determining a correction to a measured height of the substrate based on a difference between the first and second normalized height data.

14. The method of claim 13, wherein the step of normalizing the first data includes performing convolution of the first data with the second sensor footprint to produce the first normalized height data, and the step of normalizing the second data includes convolution of the second data with the first sensor footprint to produce the second normalized height data.

15. The method of claim 13, wherein the height of the at least a portion of the substrate for processing in a lithographic apparatus is measured outside the lithographic apparatus.

16. A computer apparatus for determining a height of at least of a portion of a substrate, the apparatus comprising:
    a memory storing processor readable instructions; and
    a processor configured to read and execute instructions stored in the memory,
    wherein the processor readable instructions comprise instructions configured to control the computer apparatus to:
       normalize a first data corresponding to a first signal from a first sensor with a second sensor footprint to produce a first normalized result, wherein the first signal corresponds to a sensed height of the substrate over a first area;

normalize a second data corresponding to a second signal from a second sensor with the first sensor footprint to produce a second normalized result, wherein the second signal corresponds to a sensed height of the substrate over a second area; and determine a correction to a measured height of the substrate based on a difference between the first and second normalized results.

17. The computer apparatus of claim 16, wherein the processor readable instructions comprise instructions configured to control the computer to normalize the first data by convolution of the first data with the second sensor footprint to produce the first normalized height data and to normalize the second data by convolution of the second data with the first sensor footprint to produce the second normalized height data.

18. The computer apparatus of claim 16, wherein the processor readable instructions comprise instructions configured to control the computer to operate adjustment means to adjust a photolithographic depth-of-focus of a radiation beam on the substrate based at least upon the determined correction to the measured height of at least a portion of the substrate.

* * * * *